(12) United States Patent
Leriche et al.

(10) Patent No.: US 6,542,760 B2
(45) Date of Patent: *Apr. 1, 2003

(54) METHOD OF DECOUPLING AN HTC SUPERCONDUCTIVE MULTI-FILAMENT STRAND HAVING A SILVER-BASED MATRIX, AND A MULTIFILAMENT STRAND MADE THEREBY

(75) Inventors: Albert Leriche, Gif sur Yvette (FR); Erick Beghin, Boulogne (FR); Gérard Duperray, La Norville (FR); Denis Legat, Lisses (FR); Peter Friedrich Herrmann, Corbeuse (FR)

(73) Assignee: Nexans, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/840,271

(22) Filed: Apr. 24, 2001

(65) Prior Publication Data

US 2001/0021690 A1 Sep. 13, 2001

Related U.S. Application Data

(62) Division of application No. 09/044,056, filed on Mar. 19, 1998, now Pat. No. 6,272,731.

(30) Foreign Application Priority Data

Mar. 20, 1997 (FR) ............................................ 97 03416

(51) Int. Cl.⁷ .......................... H01B 12/10; H01L 39/08
(52) U.S. Cl. ....................... 505/231; 505/236; 505/237; 174/125.1
(58) Field of Search ................................. 505/231, 236, 505/237; 174/125.1

(56) References Cited

U.S. PATENT DOCUMENTS 4,531,982 A 7/1985 Dubots
5,849,670 A * 12/1998 Nabatame et al. .......... 505/230

(List continued on next page.)

FOREIGN PATENT DOCUMENTS

| EP | 0 358 779 A1 | 3/1990 |
| EP | 0 412 527 A2 | 2/1991 |
| EP | 0 503 525 A1 | 9/1992 |

(List continued on next page.)

*Primary Examiner*—Mark Kopec
(74) *Attorney, Agent, or Firm*—Sughrue Mion, PLLC

(57) ABSTRACT

The invention relates a powder in tube type method of making an HTc superconductive multifilament strand having a silver-based matrix, in which:

a first envelope is filled with powder reagents for an HTc superconductor;

the resulting billet is drawn down into a monofilament strand;

said monofilament strand is cut up into lengths and a secondary envelope is filled with the resulting lengths, thereby making a multifilament billet which is drawn down into a multifilament strand;

said multifilament strand is cut up into lengths and a new envelope is filled with the resulting lengths, thereby making a new multifilament billet which is drawn down into a new multifilament strand; and it is shaped and subjected to heat treatment;

according to the invention, at least one face of the monofilament strand is electrically insulated; and during the first multifilament step the secondary envelope is filled with the resulting insulated lengths.

3 Claims, 3 Drawing Sheets

U.S. PATENT DOCUMENTS

| | | | |
|---|---|---|---|
| 5,902,774 A | | 5/1999 | Muranaka et al. |
| 5,908,812 A | * | 6/1999 | Cotton et al. ............... 505/230 |
| 6,110,873 A | | 8/2000 | Duperray et al. |
| 6,271,475 B1 | * | 8/2001 | Otto et al. ............... 174/125.1 |
| 6,344,430 B1 | * | 2/2002 | Duperray et al. ........... 505/237 |

FOREIGN PATENT DOCUMENTS

| | | | |
|---|---|---|---|
| EP | 638942 | * | 2/1995 |
| EP | 0 803 917 A1 | | 10/1997 |
| WO | WO 96/28853 | | 9/1996 |

* cited by examiner

METHOD OF DECOUPLING AN HTC SUPERCONDUCTIVE MULTI-FILAMENT STRAND HAVING A SILVER-BASED MATRIX, AND A MULTIFILAMENT STRAND MADE THEREBY

This is a Divisional of Application No. 09/044,056 filed Mar. 19, 1998 now U.S. Pat. No. 6,272,731.

The invention relates to a high critical temperature (HTc) superconductive multifilament strand and to a method of making such a strand. More particularly, the invention relates to an HTc superconductive multifilament strand clad in silver and used with AC, and to a method of making such a strand.

BACKGROUND OF THE INVENTION

The use of HTc superconductive multifilament strands with AC requires good decoupling of the HTc superconductive filaments making it up in order to limit energy losses due to induced currents.

It is known to make HTc multifilament strands by the "powder in tube" technique. That consists in filling a billet with powder reagents that are suitable, after heat treatment, for transforming into a superconductive material, and in particular into a material of the HTc ceramic type.

The billet is then closed under a vacuum and drawn down, after which it is put into a bundle in a new billet itself in turn closed under a vacuum and then drawn down. The resulting multifilament strand may be subjected to the same steps, and so on until a desired number of filaments per unit area has been obtained.

The strand made in this way is then put into its final form, e.g. by rolling and/or twisting, and is then subjected to heat treatment to transform its powder reagents.

The material constituting the billets must be sufficiently ductile to be capable of withstanding the various drawing-down and rolling stages, and its composition must be inert or at least without consequence for the heat treatment that transforms the powder reagents into a superconductive phase. It is known that silver can be used as the material constituting the billets.

However, silver is a material that is very highly conductive at the operating temperatures of HTc superconductors. As a result there is practically no electrical decoupling between the filaments.

It is known that Ag can be doped with impurities of the Pd or Au type to 1% or 2%. That technique makes it possible to gain two decades in resistivity at 20 K.

That technique can also be used for applications at 77 K. However, the Ag/Pd alloy is expensive which makes it economically inconceivable in mass production applications.

In addition to increasing the resistivity of the silver-based matrix, it is also known to twist the conductor at a very small pitch with a very small filament diameter. However the resulting decoupling is not sufficient in most AC applications.

SUMMARY OF THE INVENTION

One of the objects of the present invention is to propose a multifilament strand in which filament decoupling is significantly improved.

To this end, the invention provides a powder in tube type method of making an HTc superconductive multifilament strand having a silver-based matrix, in which:

in a monofilament step, a first silver-based envelope is filled with powder reagents suitable, after heat treatment, for transforming into an HTc superconductive material;

the resulting billet is drawn down into a monofilament strand with a cross-section that is square or rectangular in shape;

in a first multifilament step said monofilament strand is cut into lengths and a secondary silver-based envelope of square or rectangular section is filled with the resulting lengths, thereby making a multifilament billet, the multifilament billet being drawn down in turn to form a multifilament strand of square or rectangular section;

in a secondary multifilament step, that is performed at least once, said multifilament strand is cut up into lengths and a new silver-based envelope of square or rectangular section is filled with the resulting lengths, thereby making a new multifilament billet, the new multifilament billet being drawn down in turn to form a new multifilament strand of square or rectangular section;

the new multifilament strand is shaped; and heat treatment is applied to the shaped strand;

according to the invention, at least one face of the monofilament strand is electrically insulated; and during the first multifilament step the silver-based secondary envelope of square or rectangular section is filled with the resulting lengths, thereby making the multifilament billet.

In one implementation, a layer of electrically insulating material is deposited on the faces to be insulated of the lengths of the monofilament strand.

In another implementation, while making the multifilament billet of the first multifilament step, an electrically insulating material is interposed between the faces to be insulated of the lengths of monofilament strand placed in the envelope.

According to another characteristic of the method of the invention, during a secondary multifilament step at least one of the faces of the multifilament strand is insulated; then the new silver-based envelope of square or rectangular section is filled with the resulting lengths, thereby making a new multifilament billet.

In an implementation, a layer of electrically insulating material is deposited on the faces to be insulated of the lengths of the multifilament strand.

In another implementation, while making the multifilament billet of the secondary multifilament step, an electrically insulating material is interposed between the faces to be insulated of the lengths of multifilament strand placed in the envelope.

The invention also provides an HTc superconductive multifilament strand having a cross-section that is generally square or rectangular in shape, comprising a plurality of superconductive filaments, each superconductive filament having a cross-section that is generally square or rectangular in shape, comprising a core of HTc superconductive ceramic, said HTc superconductive ceramic core being surrounded by Ag cladding.

According to the invention, each superconductive filament includes an electrically insulating layer on at least one of the faces of its Ag cladding.

A first advantage of the present invention results from better decoupling characteristics of the filaments because of the existence of an insulating layer on at least one face of each filament.

Another advantage of the present invention results from a reduction in the cost of fabricating a strand of the invention.

Another advantage of the present invention results from the fact that the method proposed by the invention can be implemented on existing fabrication devices.

BRIEF DESCRIPTION OF THE DRAWINGS

Other advantages an characteristics of the present invention appear from the following description given with reference to the accompanying drawings, in which.

DETAILED DESCRIPTION OF THE PREFERRED EMBODIMENTS

Figure 1:
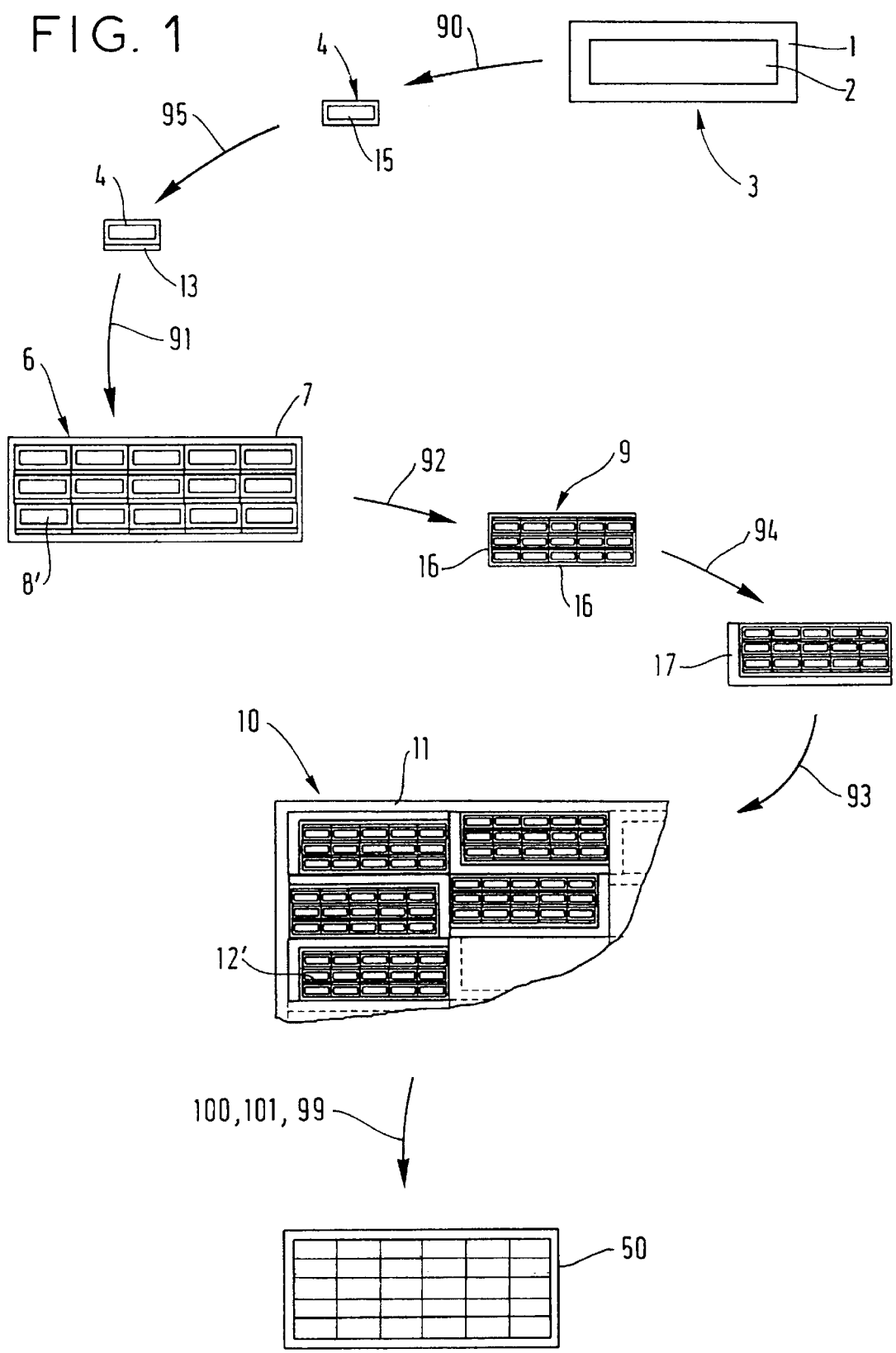
FIG. 1 is a flow chart of an implementation of the method of the invention.

In the description below, the term "electrically insulating material" is used to designate a material which is naturally electrically insulating or a material which becomes insulating after the mechanical and/or heat treatment to which the multifilament strand is subjected in the method of the invention.

According to the invention, the powder in tube method of making an HTc superconductive multifilament strand having a silver-based matrix comprises the following known steps:

in a monofilament step, a first silver-based envelope 1 is filled with powder reagents 2 suitable, after heat treatment, for transforming into an HTc superconductive material;

the resulting billet 3 is drawn down 90 into a monofilament strand 4 with a cross-section that is square or rectangular in shape;

in a first multifilament step 91, 92 said monofilament strand 4 is cut into lengths and a secondary silver-based envelope 7 of square or rectangular section is filled 91 with the resulting lengths 8, 8', thereby making a multifilament billet 6, the multifilament billet 6 being drawn down 92 in turn to form a multifilament strand 9 of square or rectangular section;

in a secondary multifilament step 93, 99, that is performed at least once, said multifilament strand 9 is cut up into lengths and a new silver-based envelope 11 of square or rectangular section is filled 93 with the resulting lengths 12, 12', thereby making a new multifilament billet, the new multifilament billet being drawn down 99 in turn to form a new multifilament strand so of square or rectangular section;

the new multifilament strand 50 is shaped 100; and heat treatment 101 is applied to the shaped strand.

By way of example, the shaping step 100 comprises reducing the conductor to the desired dimensions and then twisting it. By way of example, the purpose of the heat treatment 101 is to transform the powder precursors into an HTc superconductive ceramic and to relax the stresses due to the various mechanical treatments to which the conductor has been subjected.

The method of the invention introduces additional steps whereby at least one face 15 of the monofilament strand 4 is electrically insulated 91', 95; and during the first multifilament step 91, 92 the silver-based secondary envelope 7 of square or rectangular section is filled 91 with the resulting lengths 8, 8', thereby making the multifilament billet 6.

The resulting multifilament strand 9 therefore presents a plurality of monofilaments 8, 8' all having at least one face 15 that is provided with an electrically insulating material 13, 14. In the implementation shown in the figures, only one face 15 of the multifilament strand 4 is insulated. The lengths 8, 8' are then organized so that pairs of adjacent layers of lengths 8. 8' are insulated from one another.

In the implementation shown in FIG. 1, a layer of electrically insulating material 13 is deposited at 95 on the faces 15 of the monofilament strand 4 that are to be insulated. Any method appropriate for depositing a thin layer can be used.

Figure 2:
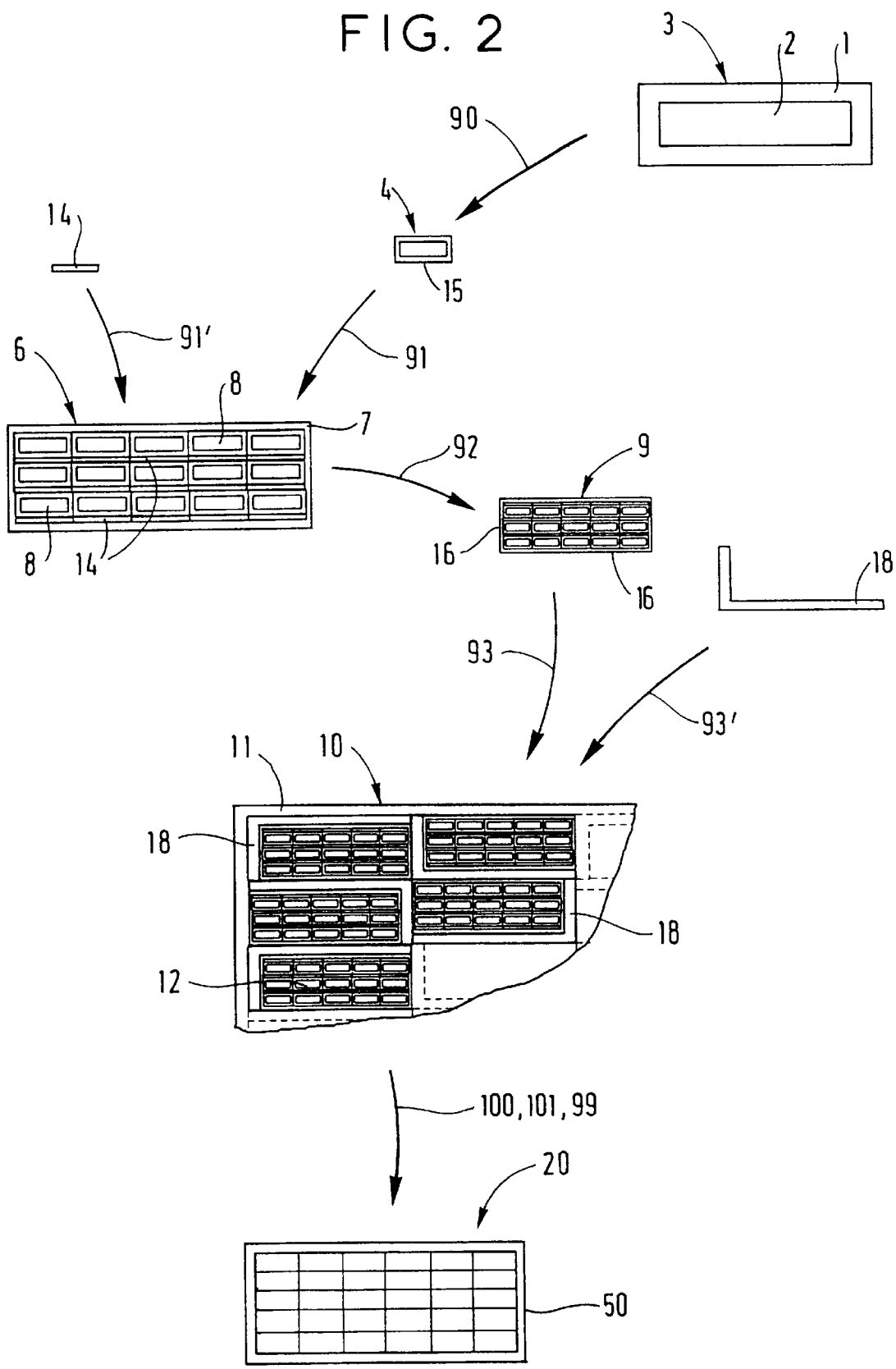
FIG. 2 is a flow chart of another implementation of the method of the invention.

In the embodiment shown in FIG. 2, at 91, while making the multifilament billet 6 of the first multifilament step, an electrically insulating material 14 is interposed at 91' between the faces 15 to be insulated of the monofilament strand lengths organized in the envelope 7. The insulating material may be in the form of a plate interposed between each layer of monofilaments.

Another characteristic of the present method results from the following additional steps in which:

during the secondary multifilament step 93, 99 at least one 16 of the faces of the multifilament strand 9 is insulated 93', 94; then the new silver-based envelope 11 of square or rectangular section is filled 93 with the resulting lengths 12, 12', thereby making a new multifilament billet 10.

The new multifilament strand thus presents a plurality of multifilament strands 12, 12' all having at least one face 16 provided with an electrically insulating material 17, 18.

In the implementation shown in the figures, two adjacent faces 16 of the multifilament strand 9 are insulated. The lengths 12, 12' are then organized in such a manner that each multifilament length is isolated from the multifilament lengths surrounding it.

In the implementation shown in FIG. 1, a layer of electrically insulating material 17 is deposited at 94 on the faces 16 to be insulated of the lengths 12' of the multifilament strand 9.

In the implementation shown in FIG. 2, when making at 93 the multifilament billet 10 of the secondary multifilament step, an electrically insulating material 18 is interposed at 93' between the faces 16 to be insulated of the lengths 12 of multifilament strand 9 organized in the envelope 11. The shape of the electrically insulating material 18 that is interposed need not be L-shaped. For example, the interposed electrically insulating material may be in the form of a cross so as to insulate four multifilament lengths that have a corner in common.

Transforming the precursors into the superconductive phase requires oxygen to be present. Another object of the present invention is co provide an HTc superconductive multifilament strand that presents an optimized compromise between decoupling the filaments and oxygen permeability for the purpose of transformation into the HTc superconductive phase.

Figure 3:
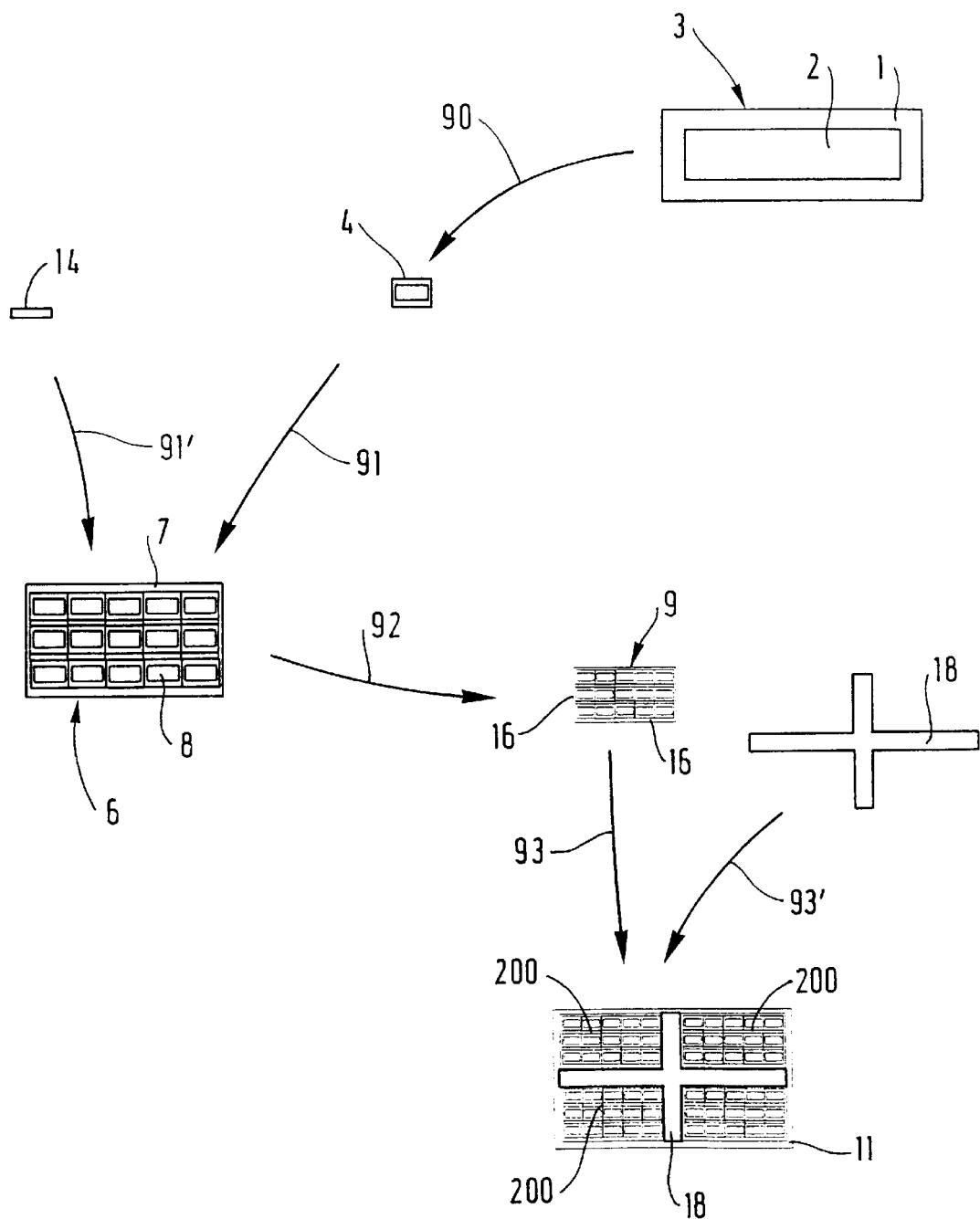
FIG. 3 is a flow chart of another implementation of the method of the invention.

To this end, the invention proposes applying the method of the invention to only four lengths 20 of multifilament strand 9 in a single secondary multifilament step. Thus, the lengths 200 are well insulated from one another while still having sufficient area without any insulating barrier in contact with the Ag envelope. Oxygen passes through the envelope 11 towards the four multifilament lengths 200. In addition, because the insulating barrier is located on one face only of each filament, oxygen can easily reach the precursors in the core of each filament by passing through the Ag wall that is not provided with an insulting barrier (cf. FIG. 3).

The invention also provides an HTc superconductive multifilament strand whose cross-section is generally square or rectangular in shape, comprising a plurality of superconductive filaments, each superconductive filament itself having a cross-section that is generally square or rectangular in shape, and containing an HTc superconductive ceramic core, said HTc superconductive ceramic core being surrounded by Ag cladding.

According to the invention, each superconductive filament has an electrically insulating layer on at least one of the faces of the Ag cladding.

What is claimed is:

1. An HTc superconductive multifilament strand having a cross-section that is square in shape, comprising:

a plurality of superconductive filaments assembled into a billet, each superconductive filament having a cross-section that is square in shape, comprising a core of HTc superconductive ceramic, each of said HTc superconductive ceramic cores being surrounded by Ag cladding, wherein each superconductive filament includes an electrically insulating layer on at least one of the faces of its Ag cladding in order to form an insulating layer between each superconductive filament when the plurality of superconductive filaments are assembled into the billet.

2. The HTc superconductive multifilament strand according to claim 1, wherein the plurality of superconductive filaments are assembled in the billet in a plurality of rows, so that the insulating layers of each superconductive filament form a continuous insulating layer between each row of superconductive filaments assembled in the billet.

3. The HTc superconductive multifilament strand according to claim 1, wherein no more than three faces of each superconductive filament has the insulating layer thereon.

* * * * *